(12) United States Patent
Nguyen et al.

(10) Patent No.: US 7,137,512 B2
(45) Date of Patent: Nov. 21, 2006

(54) REMOVABLE RAILS FOR USE ON RACKS

(75) Inventors: Minh H. Nguyen, Katy, TX (US); Donald Caballero, Humble, TX (US); Paul E. Westphall, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 73 days.

(21) Appl. No.: 10/368,853

(22) Filed: Feb. 19, 2003

(65) Prior Publication Data

US 2004/0159618 A1 Aug. 19, 2004

(51) Int. Cl.
*A47F 5/00* (2006.01)
*A47B 8/00* (2006.01)

(52) U.S. Cl. .................. 211/26; 211/183; 312/223.1; 312/333

(58) Field of Classification Search .................. 211/26, 211/191, 187, 190–192, 168, 171, 173, 174, 211/90.01, 90.02, 96, 97, 98–103, 150, 153, 211/204, 206; 312/223.1, 223.5, 334.7, 223.4, 312/222; 248/617, 19.1, 258; 49/257; 403/303, 403/304

See application file for complete search history.

(56) References Cited

U.S. PATENT DOCUMENTS

| | | |
|---|---|---|
| 1,231,291 A | 6/1917 | Otte |
| 1,938,908 A | 12/1933 | Hunter |
| 1,963,220 A | 6/1934 | Anderson |
| 2,277,702 A | 3/1942 | Kennedy et al. |
| 2,346,167 A | 4/1944 | Jones et al. |
| 2,679,447 A | 5/1954 | Bissman |
| 2,960,378 A | 11/1960 | Myers |
| 3,059,978 A | 10/1962 | Fall |
| 3,092,429 A | 6/1963 | Barnes |
| 3,133,768 A | 5/1964 | Klakovich |
| 3,324,595 A * | 6/1967 | Loomis .................. 410/137 |
| 3,377,115 A | 4/1968 | Hansen et al. |
| 3,488,097 A | 1/1970 | Fall |
| 3,650,578 A | 3/1972 | Del Vecchio et al. |
| 3,679,274 A | 7/1972 | Nance |
| 3,687,505 A | 8/1972 | Fall et al. |
| 3,712,690 A | 1/1973 | Fall |
| 3,716,284 A | 2/1973 | Vogt |
| 3,738,716 A | 6/1973 | Lambert |
| 3,778,120 A | 12/1973 | Hagen et al. |
| 3,779,623 A | 12/1973 | Motohashi |
| 3,844,627 A | 10/1974 | Gutner |
| 3,885,846 A * | 5/1975 | Chuang et al. ............. 312/306 |
| 3,901,564 A | 8/1975 | Armstrong |

(Continued)

FOREIGN PATENT DOCUMENTS

DE 4230706 3/1994

OTHER PUBLICATIONS

COMPAQ Typhoon Mechanical Specification Version 0.01, Nov. 8, 1994 by Joseph Allen, Systems Division of Compaq Computer Corporation, 15 pages.

(Continued)

*Primary Examiner*—Richard E. Chilcot, Jr.
*Assistant Examiner*—Jared W. Newton

(57) ABSTRACT

A rack system is disclosed for mounting various devices. The rack system comprises at least one front vertical support column and at least one rear vertical support column. A rail is deployed between the front vertical support column and the rear vertical support column. Additionally, a latching system is provided that enables secure engagement of the rail and easy removal of the rail.

27 Claims, 3 Drawing Sheets

U.S. PATENT DOCUMENTS

| | | | |
|---|---|---|---|
| 3,912,341 A | 10/1975 | Stein | |
| 4,025,138 A | 5/1977 | Kittle | |
| 4,067,632 A | 1/1978 | Sekerich | |
| 4,191,436 A | 3/1980 | Cherry | |
| 4,194,793 A | 3/1980 | Offermans | |
| 4,324,439 A | 4/1982 | Hagen et al. | |
| 4,331,369 A | 5/1982 | Lazar et al. | |
| 4,406,374 A * | 9/1983 | Yedor | 211/192 |
| 4,427,245 A | 1/1984 | Litchfield et al. | |
| 4,479,198 A | 10/1984 | Romano et al. | |
| 4,479,263 A | 10/1984 | Rowenfeldt et al. | |
| 4,662,761 A | 5/1987 | Hoffman | |
| 4,772,079 A | 9/1988 | Douglas et al. | |
| 4,949,934 A | 8/1990 | Krenz et al. | |
| 4,977,532 A | 12/1990 | Borkowicz et al. | |
| 4,988,214 A | 1/1991 | Clement | |
| 5,143,432 A | 9/1992 | Ohshima et al. | |
| 5,162,845 A | 11/1992 | Ariyama et al. | |
| 5,164,886 A | 11/1992 | Chang | |
| 5,197,789 A | 3/1993 | Lin | |
| 5,207,781 A * | 5/1993 | Rock | 312/319.1 |
| 5,208,722 A | 5/1993 | Ryan et al. | |
| 5,209,572 A | 5/1993 | Jordan | |
| 5,262,923 A | 11/1993 | Batta et al. | |
| 5,269,598 A | 12/1993 | Liu | |
| 5,277,615 A | 1/1994 | Hastings et al. | |
| 5,278,351 A | 1/1994 | Herrick | |
| 5,284,254 A | 2/1994 | Rinderer | |
| 5,340,340 A | 8/1994 | Hastings et al. | |
| 5,372,417 A | 12/1994 | Buie et al. | |
| 5,381,315 A | 1/1995 | Hamaguchi et al. | |
| 5,397,176 A | 3/1995 | Allen et al. | |
| 5,417,496 A | 5/1995 | Hobbs | |
| 5,438,476 A | 8/1995 | Steffes | |
| 5,460,441 A | 10/1995 | Hastings et al. | |
| 5,469,037 A | 11/1995 | McMurtrey, Sr. et al. | |
| 5,491,611 A | 2/1996 | Stewart et al. | |
| 5,551,775 A | 9/1996 | Parvin | |
| 5,552,959 A | 9/1996 | Penniman et al. | |
| 5,571,256 A | 11/1996 | Good et al. | |
| 5,586,817 A | 12/1996 | Hubbard et al. | |
| 5,598,318 A | 1/1997 | Dewitt et al. | |
| 5,637,124 A | 6/1997 | Diachuk | |
| 5,684,671 A | 11/1997 | Hobbs et al. | |
| 5,717,575 A | 2/1998 | Copeland et al. | |
| 5,726,866 A | 3/1998 | Allen | |
| 5,734,557 A | 3/1998 | McAnally et al. | |
| 5,737,184 A | 4/1998 | Lai | |
| 5,768,097 A | 6/1998 | Jelinger | |
| 5,772,294 A | 6/1998 | Hendrich et al. | |
| 5,779,333 A | 7/1998 | Lautenschlager | |
| 5,784,251 A | 7/1998 | Miller et al. | |
| 5,784,252 A | 7/1998 | Villa et al. | |
| 5,801,921 A | 9/1998 | Miller | |
| 5,823,647 A | 10/1998 | Miyoshi | |
| 5,833,337 A | 11/1998 | Kofstad | |
| 5,839,373 A | 11/1998 | Lin | |
| 5,852,543 A | 12/1998 | Kannler | |
| 5,941,621 A | 8/1999 | Boulay et al. | |
| 5,946,953 A * | 9/1999 | Feldpausch | 70/78 |
| 6,015,195 A * | 1/2000 | Anderson et al. | 312/223.2 |
| 6,021,047 A | 2/2000 | Lopez et al. | |
| 6,070,742 A | 6/2000 | McAnally et al. | |
| 6,142,590 A | 11/2000 | Harwell | |
| 6,181,549 B1 | 1/2001 | Mills et al. | |
| 6,185,092 B1 | 2/2001 | Landrum et al. | |
| 6,201,690 B1 | 3/2001 | Moore et al. | |
| 6,209,979 B1 | 4/2001 | Fall et al. | |
| 6,224,177 B1 | 5/2001 | Chu | |
| 6,230,903 B1 | 5/2001 | Abbott | |
| 6,231,138 B1 | 5/2001 | Janson | |
| 6,257,683 B1 | 7/2001 | Yang | |
| 6,259,605 B1 | 7/2001 | Schmitt | |
| 6,305,556 B1 | 10/2001 | Mayer | |
| 6,360,900 B1 | 3/2002 | Carbonneau et al. | |
| 6,385,036 B1 | 5/2002 | Chien | |
| 6,422,399 B1 * | 7/2002 | Castillo et al. | 211/26 |
| 6,424,534 B1 | 7/2002 | Mayer et al. | |
| 6,431,668 B1 | 8/2002 | Reddicliffe | |
| 6,490,153 B1 | 12/2002 | Casebolt et al. | |
| 6,547,081 B1 | 4/2003 | Kaminski | |
| 6,554,142 B1 * | 4/2003 | Gray | 211/26 |
| 6,574,100 B1 | 6/2003 | Anderson | |
| 6,588,866 B1 | 7/2003 | Cheng | |
| 6,601,713 B1 * | 8/2003 | Kaminski | 211/26 |
| 6,615,992 B1 * | 9/2003 | Lauchner et al. | 211/26 |
| 6,644,480 B1 * | 11/2003 | Kaminski | 211/26 |
| 6,648,149 B1 * | 11/2003 | Robertson | 211/26 |
| 6,655,534 B1 * | 12/2003 | Williams et al. | 211/26 |
| 6,666,340 B1 * | 12/2003 | Basinger et al. | 211/26 |
| 6,681,942 B1 | 1/2004 | Haney | |
| 6,702,124 B1 * | 3/2004 | Lauchner et al. | 211/26 |
| 6,702,412 B1 * | 3/2004 | Dobler et al. | 312/334.5 |
| 6,736,277 B1 | 5/2004 | Lauchner et al. | |
| 6,773,080 B1 * | 8/2004 | Chen et al. | 312/265.1 |
| 6,948,691 B1 * | 9/2005 | Brock et al. | 248/222.13 |
| 2001/0037985 A1 | 11/2001 | Varghese et al. | |
| 2002/0104942 A1 | 8/2002 | Mimlitch, III et al. | |
| 2003/0052580 A1 | 3/2003 | Dobler et al. | |
| 2003/0193781 A1 | 10/2003 | Mori | |
| 2004/0080247 A1 | 4/2004 | Dobler et al. | |
| 2004/0120123 A1 | 6/2004 | Mayer | |
| 2004/0217073 A1 | 11/2004 | Dobler et al. | |

OTHER PUBLICATIONS

Universal, Low-Cost Hard-File Mounting Assembly, IBN Technical Disclosure Bulletin, vol. 28, No. 6, Nov. 1985, 2 pages.

Spring-Loaded File Rails, IBM Technical Disclosure Bulletin, vol. 28, No. 12, May 1986, 3 pages.

Bridge Assembly for Mounting Interchangeable Electromagnetic Devices, IBM Technical Disclosure Bulletin, vol. 29, No. 9, Feb. 1987, 2 pages.

Direct-Access Storage Device Commodity-Stacking Plates, IBM Technical Disclosure Bulletin, vol. 30, No. 1, Jun. 1987, 2 pages.

U.S. Appl. No. 09/691,382, filed Oct. 18, 2000; Entitled: "Rack System for Mounting Electronic Devices"; Inventor: Bolognia et al.

* cited by examiner

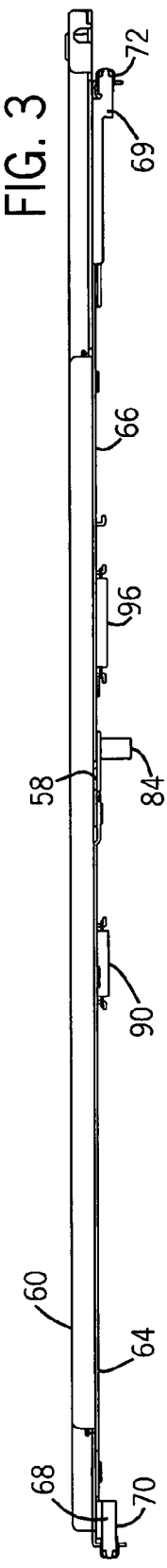
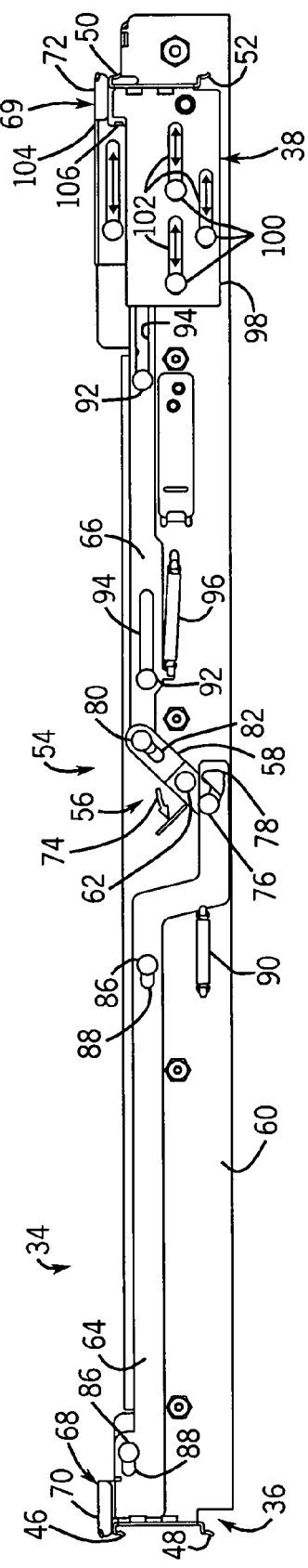

REMOVABLE RAILS FOR USE ON RACKS

BACKGROUND OF THE INVENTION

Various racks are used to hold multiple devices in an organized manner. For example, racks are utilized in mounting servers and/or other computer based devices. The servers or other devices are mounted on horizontal rails connected to vertical support columns. The rails are attached to the vertical support columns by, for example, fasteners, such as screws, bolts and/or nuts. With this type of rail, tools are required to attach the screws, bolts and nuts.

In other rail designs, multiple loose parts are assembled to complete the rail assembly before installing it on the rack. Also, the installation technician often must walk back and forth between the front and the rear of the rack to install each end of the rail assembly to the vertical support columns. In some applications, two installation technicians may be required to complete the task.

BRIEF DESCRIPTION OF THE DRAWINGS

Certain embodiments of the invention will hereafter be described with reference to the accompanying drawings, wherein like reference numerals denote like elements, and:

FIG. 2 is a side view of some embodiments of a rail illustrated in FIG. 1;

FIG. 3 is a top view of the rail illustrated in FIG. 2;

DETAILED DESCRIPTION

Figure 1:
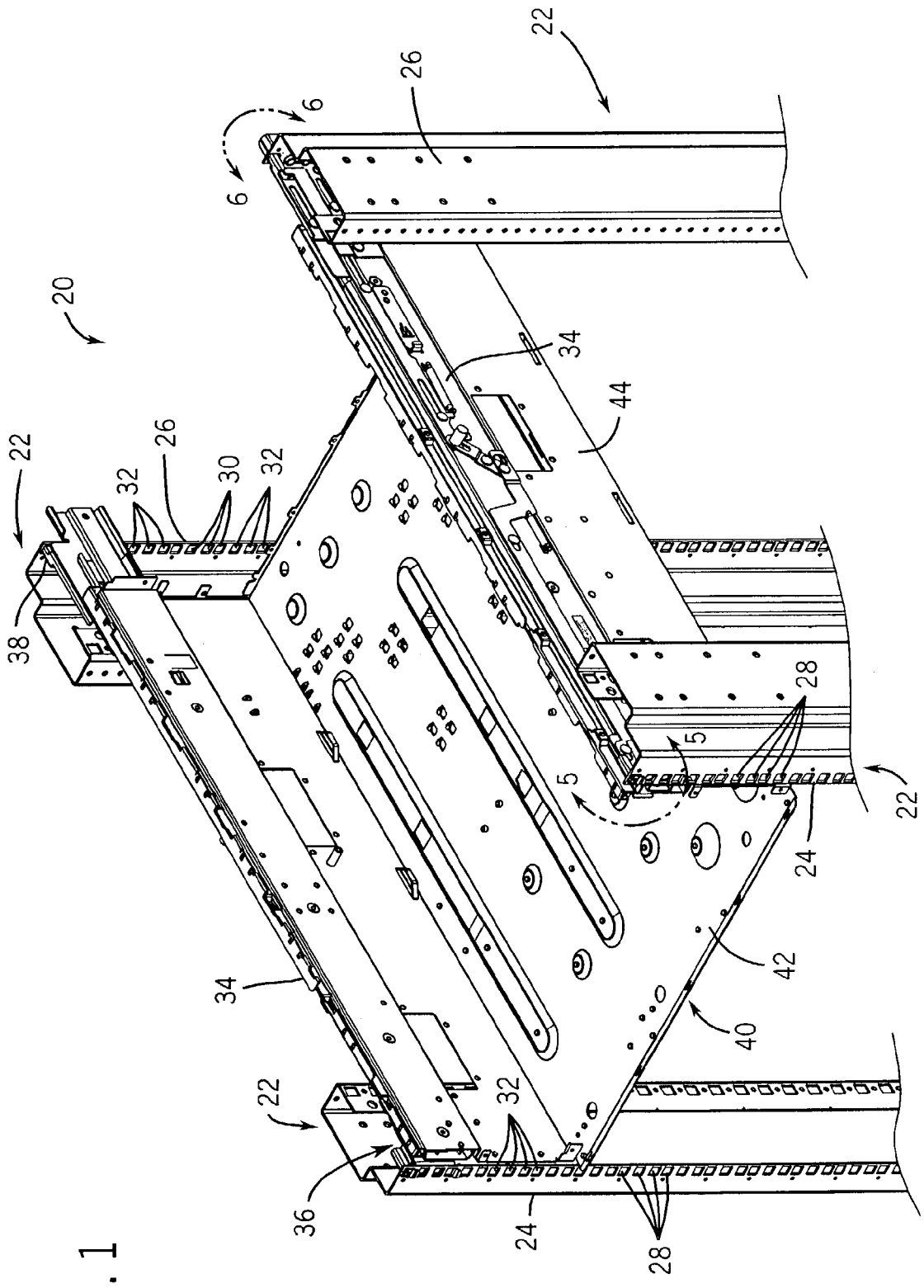
FIG. 1 is a perspective view of a rack system according to embodiments of the present invention.

Referring generally to FIG. 1, a rack system 20 is illustrated according to embodiments of the present invention. Rack system 20 comprises a plurality of vertical support columns 22. In the embodiment illustrated, vertical support columns 22 comprise at least one front support column 24, e.g. two front support columns 24, and at least one rear support column 26, e.g. two rear support columns 26.

Each of the front vertical support columns 24 comprises a plurality of front mount features 28 that may be arranged in a series that extends generally vertically along at least a portion of each front support column 24. Similarly, each of the rear support columns 26 may comprise a plurality of rear mount features 30 that may be arranged in a series extending generally vertically along each rear support column 26 for at least a portion of the rear support column. In the embodiment illustrated, front mount features 28 and rear mount features 30 comprise a plurality of openings 32 that extend through the material, e.g. steel, from which front support columns 24 and rear support columns 26 are formed. Openings 32 may, for example, be formed as square holes.

Rack system 20 further comprises a rail 34 that is readily engaged with or disengaged from front support column 24 and rear support column 26. Rail 34 extends between a front support column 24 and a rear support column 26 and is removably mounted to front support column 24 and rear support column 26 via a front engagement end 36 and a rear engagement end 38, respectively. In the embodiment illustrated in FIG. 1, a pair of rails 34 is illustrated as slidably mounting a device 40 in rack system 20. In addition, numerous other rails may be incorporated into rack system 20 to mount a plurality of devices in a generally vertical arrangement along vertical support columns 22. Device 40 may be a server, other computer-based device, or a variety of other devices for which rack system 20 is utilized. In the example illustrated in FIG. 1, device 40 is represented by a server chassis having a bottom wall 42 and a pair of side walls 44. Side walls 44 may be coupled to rails 34 by any of a variety of mechanisms, such as clips, screws, snaps or other fasteners used in, for example, existing or future rack systems.

As described more fully below, each rail 34 may be easily engaged and disengaged with its corresponding front support column 24 and rear support column 26 for simplified insertion and removal of the rails 34. With each rail 34, the front engagement end 36 is designed to engage front mount features 28, and the rear engagement end 38 is designed to engage rear mount features 30. A secure engagement of the rail 34 to the front support column 24 and rear support column 26 may be accomplished by latching rail 34 to either or both front support column 24 and rear support column 26, as will be explained in greater detail below.

Figure 4:
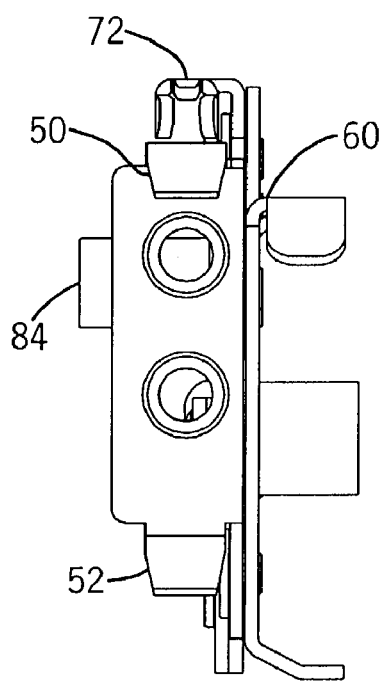
FIG. 4 is a right end view of the rail illustrated in FIG. 2.

Referring generally to FIGS. 2, 3 and 4, a rail 34 in accordance with some embodiments is illustrated in greater detail. As illustrated, front engagement end 36 may comprise a front connector, such as a hook 46 as well as one or more additional hooks 48 to facilitate connection to a corresponding front support column 24. Similarly, rear engagement end 38 may comprise a rear connector, such as a hook 50 as well as one or more additional hooks 52 that facilitate connection of rear engagement end 38 with a corresponding rear support column 26 (see FIGS. 2 and 4). In this embodiment, hooks 46, 48, 50 and 52 are designed for hooking engagement through corresponding openings 32 formed in front support column 24 and rear support column 26. However, other types of mounting features may be utilized both on front support column 24 and rear support column 26 as well as on front engagement end 36 and on rear engagement end 38.

Rail 34 further comprises a latching system 54 that is able to latch rail 34 in secure engagement with one or both of the front support column 24 and the rear support column 26. In other words, latching system 54 secures the engagement of rail 34 at its desired position in rack system 20. Latching system 54 also may be readily released to permit disengagement of rail 34 from the corresponding front support column 24 and rear support column 26.

As illustrated, a latch system 54 comprises an actuator 56 that is movable to securely engage or disengage the latch system at both the front engagement end 36 and the rear engagement end 38. The actuator 56 may comprise a pivot member 58 that is pivotably mounted to a rail support panel 60 at a pivot 62. Actuator 56 also may comprise a front linkage, such as a front slide 64 and a rear linkage, such as a rear slide 66. As illustrated, pivot member 58 may be coupled to a front latch 68 via front slide 64 and to a rear latch 69 by rear slide 66.

In some embodiments, front latch 68 comprises a pin 70, and rear latch 69 comprises a pin 72. Pins 70 and 72 are simultaneously pulled toward one another or moved away from one another depending on the direction in which pivot member 58 is pivoted. For example, if pivot member 58 is pivoted in the direction of arrow 74 (see FIG. 2), pins 70 and 72 are drawn toward one another, and if pivot member 58 is pivoted in the opposite direction, pins 70 and 72 are moved away from each other.

Pivot member 58 may be coupled to front slide 64 via a pin 76 extending from pivot member 58 and slidably received in a curved slot 78 formed in front slide 64. Pivot member 58 may be connected to rear slide 66 by a pin 80 affixed to rear slide 66 and extending through a corresponding slot 82 formed in pivot member 58. Additionally, a handle 84 (see FIG. 3) may be connected to slide pin 80 or formed integrally with slide pin 80 to facilitate pivoting of pivot member 58. Curved slot 78, formed through front slide 64, and slot 82, formed through pivot member 58, cooperate during pivoting movement of pivot member 58 to enable linear translation of front slide 64 and rear slide 66.

In some embodiments, front slide 64 is slidably mounted to rail support panel 60 by a plurality of mounting pins 86. Mounting pins 86 extend from rail support panel 60 for sliding engagement with corresponding slots 88 formed in front slide 64. Additionally, a resilient member, such as a spring 90, may be coupled between rail support panel 60 and front slide 64 to bias front slide 64 and front latch 68 towards a latched, i.e. securely engaged, position.

By way of example, rear slide 66 also may be slidably mounted to rail support panel 60 via a plurality of mounting pins 92. Mounting pins 92 extend from rail support panel 60 for slidable engagement with corresponding slots 94 formed in rear slide 66. Rear slide 66 also may be biased by a resilient member, such as a spring 96, coupled between rear slide 66 and rail support panel 60. Spring 96 biases rear slide 66 and rear latch 69 to a securely engaged or latched position.

In some embodiments, one or both of the front engagement end 36 and the rear engagement end 38 may be made linearly adjustable to enable use of rail 34 in rack systems of different sizes. For example, the distance between corresponding front support columns 24 and rear support columns 26 may be different from one type of rack to another, and the linear adjustability allows rails 34 to be used in any of a variety of racks. In the embodiment illustrated, rear engagement end 38 is linearly adjustable, and hook 50, as well as additional hook 52, is mounted to a movable member, such as a slide bracket 98. Slide bracket 98 is slidably mounted to rail support panel 60 by, for example, a plurality of slide pins 100 that extend from rail support panel 60 for sliding engagement with corresponding slots 102 formed in slide bracket 98. Thus, slide bracket 98 may be moved linearly along slide pins 100 to adjust the distance between hooks 46, 48 of front engagement end 36 and hooks 50, 52 of rear engagement end 38 according to the distance between the corresponding front support column 24 and rear support column 26 of a given rack system 20.

Slide bracket 98 also may include an abutment region 104 positioned to abutingly engage a tab 106 extending from rear slide 66. Abutment region 104 and the tab 106 ensure that the pin 72 does not slide beyond a latched position to a position that would interfere with the connection of hook 50 and the additional hook 52 on a corresponding rear support column 26.

To accommodate adjustability of the engagement end 38, slots 94 on the rear slide 66 are longer than the slots 88 formed in front slide 64. The additional lengths of the slots 94 in rear slide 66 enables the use of rail 34 in a rack system having more closely spaced front and rear support columns, i.e. a shallower depth, without affecting the latching capability of latching system 54. Curved slot 78 also has sufficient length to permit adjustment of the rail for use in rack systems having different depths. For example, when rail 34 is used in a rack system with a greater depth, actuation of pivot member 58 moves rear slide 66 and pin 72 towards a release or disengaged position. Simultaneously, slide pin 76 moves through a curved slot 78 until the slide pin 76 engages the end of the slot and begins to move front slide 64 and pin 70 to a disengaged position.

However, if the rail 34 is utilized in a rack system having a lesser depth, slide bracket 98 and rear slide 66 are positioned closer to the front engagement end 36 to accommodate the shorter distance between the front support column 24 and the rear support column 26. Simultaneously, slide pin 76 is located in the curved slot 78 toward a position where any further pivoting motion of pivot member 58 in the direction of arrow 74 (see FIG. 2) begins to release pins 70 and 72. Accordingly, when the rail 34 is to be disengaged, movement of pivot member 58 in the direction of arrow 74 immediately begins to simultaneously withdraw pins 70 and 72 from their latched position.

Figure 5:
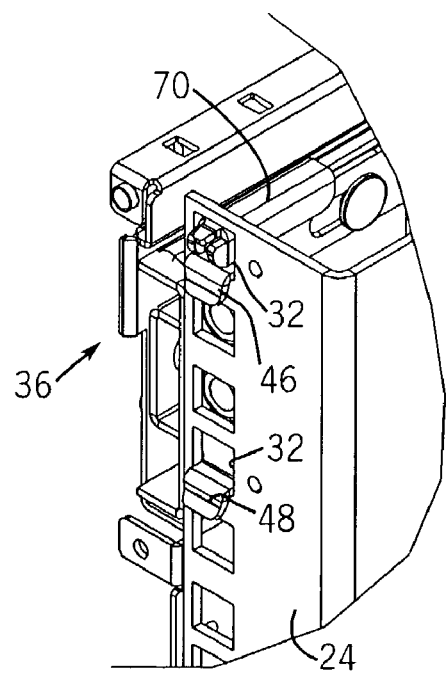
FIG. 5 is an enlarged front perspective view of the region 5—5 illustrated in FIG. 1.
Figure 6:
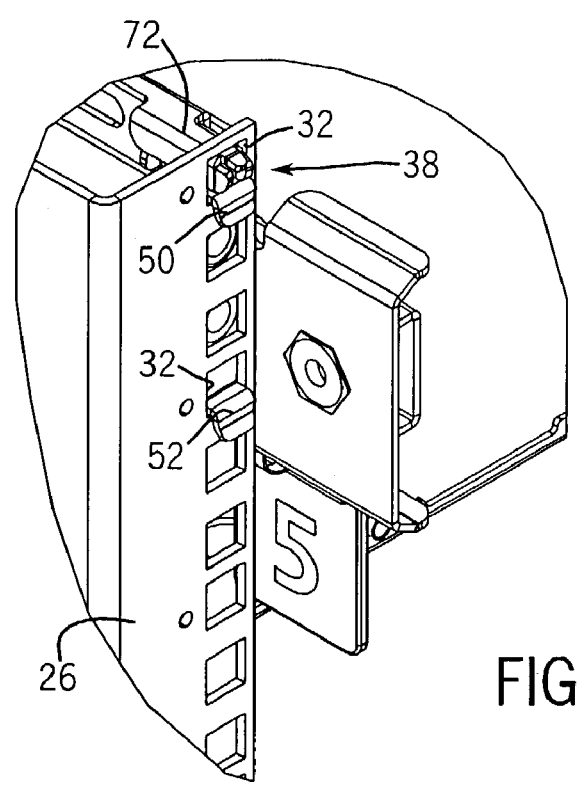
FIG. 6 is an enlarged rear perspective view of the region defined generally by line 6—6 of FIG. 1.

As illustrated, engagement of a rail 34 involves insertion of hook 46 and any additional hooks 48 through selected openings 32, as illustrated in FIG. 5. Hooks 46 and 48 rest along the bottoms of openings 32 to support the front engagement end 36. Similarly, hook 50 and any additional hooks 52 are inserted through selected openings 32 of the appropriate rear support column 26, as illustrated in FIG. 6. Hooks 50 and 52 lie along the bottoms of the selected openings 32 and support the rear of rail 34 at the desired position along rear support column 26.

When the hooks 46, 48, 50 and 52 are positioned in the selected openings 32, pivot member 58 of actuator 56 is rotated (or allowed to be rotated by springs 90 and 96) to move pins 70 and 72 into the same openings 32 through which hook 46 and hook 50 extend. Pins 70 and 72 are sized to substantially fill the corresponding openings 32 above hook 46 and hook 50, respectively, thereby preventing inadvertent removal of hooks 46 and 50 as well as front engagement end 36 and rear engagement end 38.

To disengage and remove rail 34, pivot member 58 is rotated in the direction of arrow 74 (see FIG. 2) to linearly move rear slide 66 and front slide 64 toward each other. The movement of rear slide 66 and front slide 64 disengages rear latch 69 and front latch 68. In the embodiment illustrated, rear latch 69 and front latch 68 are disengaged when pins 70 and 72 are withdrawn from their openings 32. Once pins 70 and 72 are withdrawn, rail 34 simply may be lifted to withdraw hooks 46, 48, 50 and 52 from front support column 24 and rear support column 26.

Latch system 54 enables an easy, tool-less installation and removal of rails 34 at desired positions within rack system 20. Actuator 56 permits an individual to both latch and disengage a rail with a single hand and without the use of screws or other separate components. Thus, one or more rails may be quickly installed, removed or moved to different locations within rack system 20 without the need for a technician to move between the front and the rear of the rack and without requiring additional manpower.

While the invention may be susceptible to various modifications and alternative forms, specific embodiments have been shown by way of example in the drawings and described in detail herein. However, it should be understood that the invention is not intended to be limited to the particular forms disclosed.

What is claimed is:

1. A rack system, comprising:
    at least one front vertical support column having a series of front mount features;
    at least one rear vertical support column having a series of rear mount features;
    a rail extending lengthwise from a front engagement end to a rear engagement end, wherein the front engagement end removably engages a selected front mount feature and the rear engagement end removably engages a selected rear mount feature, wherein the front engagement end or the rear engagement end is linearly adjustable to enable use of the rail in racks of different depths; and a latching system having a front latch to securely engage the front engagement end to the selected front mount feature, a rear latch to securely engage the rear engagement end to the selected rear mount feature, and an actuator disposed at a single location along the rail, wherein the actuator may be moved to disengage both the front latch and the rear latch.

2. The rack system as recited in claim 1, wherein the series of front mount features and the series of rear mount features comprise a plurality of openings.

3. The rack system as recited in claim 2, wherein the front engagement end and the rear engagement end each comprises at least one hook sized to extend into a selected opening of the plurality of openings.

4. The rack system as recited in claim 3, wherein the front latch and the rear latch each comprises a pin positioned to extend into the selected opening when the rail is engaged with the at least one front vertical support column and the at least one rear vertical support column.

5. The rack system as recited in claim 1, wherein the actuator comprises a front slide coupled to the front latch; a rear slide coupled to the rear latch; and a pivot member connected to the front slide and the rear slide.

6. The rack system as recited in claim 5, wherein the pivot member may be pivoted to release the front latch and the rear latch.

7. The rack system as recited in claim 5, wherein the front latch and the rear latch are spring biased toward an engaged position.

8. The rack system as recited in claim 1, comprising a chassis for a computer-based device coupled to the rail.

9. The rack system as recited in claim 1, wherein the rail is disengaged from the front and rear vertical support columns upon removal of the front and rear engagement ends from the front and rear mount features, respectively.

10. The rack system as recited in claim 1, wherein the front latch and the front engagement end are configured to engage the same selected front mount feature, and the rear latch and the rear engagement end are configured to engage the same selected rear mount feature.

11. The rack system as recited in claim 1, wherein the front and rear engagement ends each comprise one or more hooks configured to couple with the respective front and rear mount features via movement in a first direction to an engaging position, and the actuator is configured to secure the front and rear latches with the respective front and rear vertical support columns at a position opposite from the first direction.

12. A system, comprising:
a rail having a pair of rack engagement ends, wherein each of the rack engagement ends comprises a hook configured to fit within an opening formed in a rack; and a latching system having a pair of latches to secure engagement of the pair of rack engagement ends, the pair of latches being actuable by a single pivot member, wherein the hook and the latch at each of the rack engagement ends is configured to fit within the same opening at the respective rack engagement end.

13. The system as recited in claim 12, wherein each latch of the pair of latches comprises a pin sized to fit within the opening formed in the rack and thus block removal of the hook.

14. The system as recited in claim 12, wherein the pair of latches are coupled to the single pivot member by a pair of linkages.

15. The system as recited in claim 14, wherein the linkages are slidably mounted on the rail and spring biased to move the pair of latches to an engaged position.

16. The system as recited in claim 12, comprising a chassis for a computer-based device coupled to the rail.

17. The system as recited in claim 16, wherein the computer-based device comprises a server.

18. The system as recited in claim 12, wherein the rail is coupled to a first pair of rack legs and another rail is coupled to a second pair of rack legs opposite from the rail.

19. A system, comprising:
a rail having a pair of rack engagement ends, wherein at least one of the pair of rack engagement ends is adjustable to accommodate racks of differing depths; and a latching system having a pair of latches to secure engagement of the pair of rack engagement ends, the pair of latches being actuable by a single pivot member, wherein the latch at each of the rack engagement ends is configured to engage the same portion of a rack as the respective rack engagement end.

20. The system as recited in claim 19, comprising a chassis for a computer-based device coupled to the rail.

21. The system as recited in claim 20, wherein the computer-based device comprises a server.

22. The system as recited in claim 19, comprising an electronics chassis coupled to the rail.

23. The system as recited in claim 19, wherein the rail is coupled to a first pair of rack legs and another rail is coupled to a second pair of rack legs opposite from the rail.

24. A system, comprising:
means for selectively coupling a front engagement end and a rear engagement end of a rail with a rack;
means for securing engagement of the front engagement end and the rear engagement end to the rack; and
means for generally simultaneously disengaging the front engagement end and the rear engagement end, wherein the means for selectively coupling, the means for securing engagement, and the means for generally simultaneously disengaging comprise coupling, engaging, and disengaging with a common front opening and a common rear opening of the rack.

25. The system as recited in claim 24, wherein the means for securing engagement comprises a plurality of slidable pins.

26. The system as recited in claim 25, wherein the means for generally simultaneously disengaging comprises a single pivot member coupled to the plurality of slidable pins by a front linkage and a rear linkage.

27. The system as recited in claim 24, comprising a chassis for a computer-based device coupled to the rail.

* * * * *

UNITED STATES PATENT AND TRADEMARK OFFICE
CERTIFICATE OF CORRECTION

PATENT NO. : 7,137,512 B2  Page 1 of 1
APPLICATION NO. : 10/368853
DATED : November 21, 2006
INVENTOR(S) : Minh H. Nguyen et al.

It is certified that error appears in the above-identified patent and that said Letters Patent is hereby corrected as shown below:

Title Pg, Item (56), under "U.S. Patent Documents", in column 1, line 7, delete "2,960,378" and insert -- 2,960,376 --, therefor.

Signed and Sealed this

Fourteenth Day of July, 2009

JOHN DOLL
*Acting Director of the United States Patent and Trademark Office*